United States Patent
Hsu et al.

(10) Patent No.: US 7,279,391 B2
(45) Date of Patent: Oct. 9, 2007

(54) INTEGRATED INDUCTORS AND COMPLIANT INTERCONNECTS FOR SEMICONDUCTOR PACKAGING

(75) Inventors: Rockwell Hsu, Phoenix, AZ (US); Sriram Muthukumar, Chandler, AZ (US); Jiangqi He, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 32 days.

(21) Appl. No.: 11/251,403

(22) Filed: Oct. 14, 2005

(65) Prior Publication Data

US 2006/0038289 A1  Feb. 23, 2006

Related U.S. Application Data

(63) Continuation-in-part of application No. 11/137,974, filed on May 25, 2005, and a continuation-in-part of application No. 10/974,219, filed on Oct. 27, 2004, and a continuation-in-part of application No. 10/832,178, filed on Apr. 26, 2004.

(51) Int. Cl.
*H01L 21/20* (2006.01)

(52) U.S. Cl. ........................ 438/381; 438/618; 257/531

(58) Field of Classification Search ................ 257/531, 257/734; 438/381, 618, 391
See application file for complete search history.

(56) References Cited

U.S. PATENT DOCUMENTS

| 5,126,910 | A  | * | 6/1992  | Windsor et al.  ............... 361/42 |
| 5,478,773 | A  | * | 12/1995 | Dow et al. .................. 438/381 |
| 5,673,058 | A  | * | 9/1997  | Uragami et al. ............. 345/3.1 |
| 6,008,102 | A  | * | 12/1999 | Alford et al. ............... 438/381 |
| 6,528,349 | B1 | * | 3/2003  | Patel et al. ................. 438/117 |
| 6,552,610 | B1 | * | 4/2003  | Grebennikov et al. ...... 330/251 |
| 6,859,129 | B2 | * | 2/2005  | Tsai et al. ................... 336/200 |
| 2002/0122456 | A1 | * | 9/2002  | Fishman et al. ............. 373/150 |
| 2005/0233593 | A1 | * | 10/2005 | Brunet et al. ............... 438/710 |
| 2005/0239275 | A1 | * | 10/2005 | Muthukumar et al. ...... 438/611 |
| 2006/0033172 | A1 | * | 2/2006  | Muthukumar et al. ...... 257/408 |

FOREIGN PATENT DOCUMENTS

EP  0 725 407 A1 *  9/1996

\* cited by examiner

*Primary Examiner*—T. N. Quach
(74) *Attorney, Agent, or Firm*—David L. Guglielmi

(57) ABSTRACT

Some embodiments of the present invention include integrated inductors and compliant interconnects for semiconductor packaging.

6 Claims, 9 Drawing Sheets

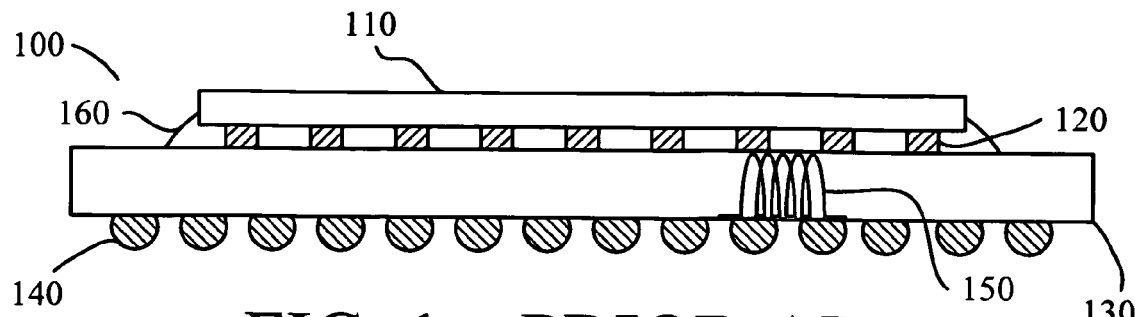
FIG. 1 – PRIOR ART
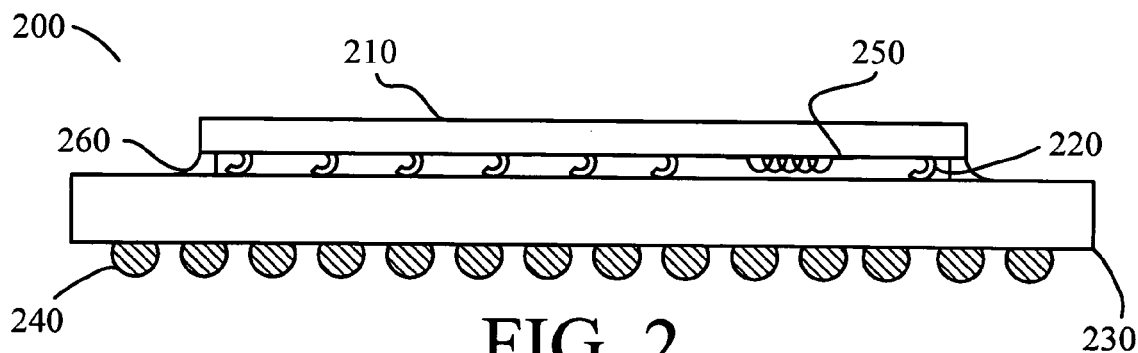
FIG. 2
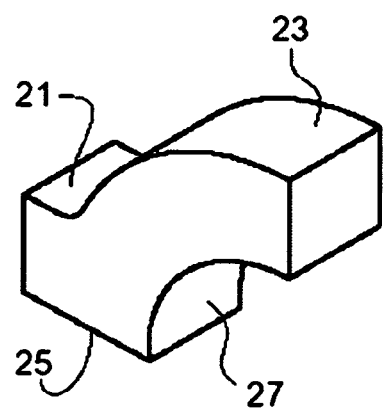
FIG. 3

INTEGRATED INDUCTORS AND COMPLIANT INTERCONNECTS FOR SEMICONDUCTOR PACKAGING

CLAIM OF PRIORITY

This application is a continuation-in-part of and claims priority to U.S. patent application Ser. No. 11/137,974 filed on May 25, 2005 entitled "High Performance Integrated Inductor," patent application Ser. No. 10/974,219 filed on Oct. 27, 2004 entitled "Compliant Interconnects for Semiconductors and Micromachines," and patent application Ser. No. 10/832,178 filed on Apr. 26, 2004 entitled "Compliant Multi-Composition Interconnects," which are incorporated herein by reference in their entirety.

TECHNICAL FIELD

Embodiments of the invention relate to semiconductor packaging. In particular, embodiments of the invention relate to integrated inductors and compliant interconnects.

BACKGROUND

In the microelectronics industry, integrated circuits (ICs) may be formed on a semiconductor die. The die may then be packaged and sold. Typically, the die may be flip-chip connected to a substrate which may provide electrical connection to a printed circuit board or motherboard. In a standard configuration, an inductor may be provided as a discrete component on the substrate. In other configurations, an inductor may be embedded in the substrate, as is illustrated in FIG. 1.

FIG. 1 illustrates an apparatus 100 including a die 110 connected by interconnects 120 to a substrate 130 having connections 140. Apparatus 100 also includes an underfill material 160 and an inductor 150. Underfill material 160 may completely surround interconnects 120 and may provide protection for die 110. Inductor 150 may be embedded in substrate 130.

Inductor 150 may provide various functions, such as energy storage, selective channel frequency, filtering, and noise reduction for die 110. In general, the performance of an inductor may improve with increased Q factor (inductor reactance over resistance), reduced resistance (R), reduced stray capacitance (C) and reduced loop inductance. Compared to an inductor mounted on substrate 130, an embedded inductor may have the advantage of providing less loop inductance. Limitations in the performance of an inductor may limit the circuit applications of the IC.

Interconnects 120 may provide electrical connection between die 110 and substrate 130. In general, it may be desirable that interconnects 120 provide minimal mechanical stress between substrate 130 and die 110.

BRIEF DESCRIPTION OF THE DRAWINGS

The invention is illustrated by way of example and not by way of limitation in the figures of the accompanying drawings, in which the like references indicate similar elements and in which:

FIG. 1 illustrates a prior art apparatus.

FIG. 2 illustrates a cross-sectional side view of a die connected by complaint interconnects to a substrate, and an integrated inductor.

FIG. 3 illustrates a perspective view of a compliant interconnect.

DETAILED DESCRIPTION

Figure 4:
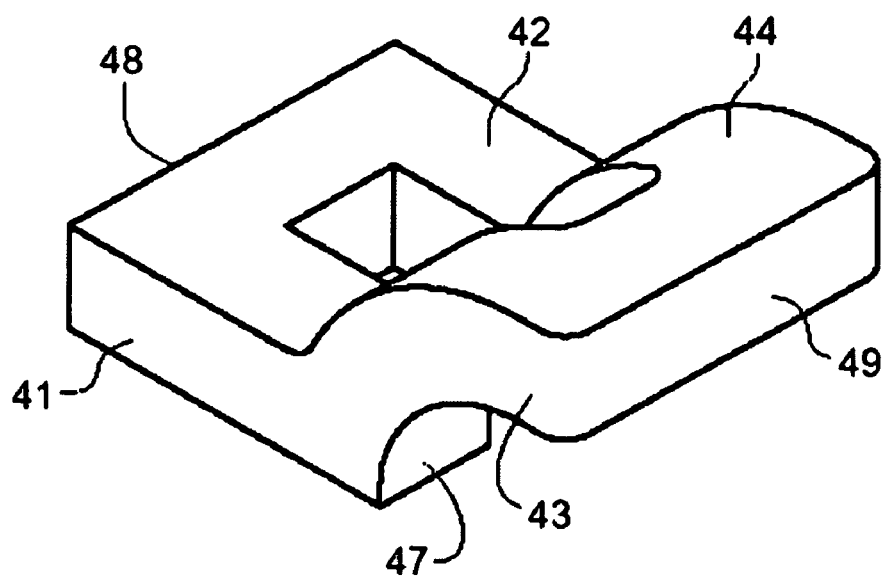
FIG. 4 illustrates a perspective view of a compliant interconnect.

In various embodiments, apparatus and methods relating to compliant interconnects and integrated inductors are described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn. However, the order of description should not be construed as to imply that these operations are necessarily order dependent. In particular, these operations need not be performed in the order of presentation.

Inductor performance may be enhanced by increasing the Q factor of the inductor, and by reducing the resistance (R) and stray capacitance (C) of the inductor. Further, implementation of inductors may be enhanced by reducing the loop inductance of the implementation. Also, integrated inductors having small form factors may be used in many packaging applications.

In particular, providing a 3-dimensional (3-D) generally spiral shaped integrated inductor, optionally including a magnetic core, may include several advantages over typical inductors. First, the 3-D generally spiral shaped integrated inductor may have enhanced performance characteristics. Also, a 3-D generally spiral shaped integrated inductor may provide similar or increased performance over discrete inductors while providing many advantages due to their small form factors. Further, implementations of 3-D generally spiral shaped integrated inductors located closer to the die may reduce the loop inductance of the implementation.

Due to these characteristics, 3-D generally spiral shaped integrated inductors may enable particular circuit applications that would not be enabled with typical inductors. Briefly, the present invention may enable particular circuit applications that may not be enabled with typical inductors.

Further, compliant interconnects may increase packaging performance because they may provide less mechanical stress on the components that are being connected while providing excellent thermal and electrical properties. In particular, compliant interconnects may provide the desired thermal, mechanical and electrical performance in the environment of low-K ILD (Inter-Layer Dielectric) architectures. The compliance offered by the optimized designs may improve reliability in the face of the stresses typically created in such low-K ILD architectures. The electrical performance of compliant interconnects may meet the power delivery and current flow requirements of proposed future microprocessor die packages. In addition, modifications of the design may allow interconnect layouts to be optimized for maximum performance. For example, highly compliant interconnects may be located near the edges of the die and lower resistance compliant interconnects may be located away from the die edges and in regions where power delivery and current flow demands are higher. Briefly, the present invention may provide both integrated inductors and compliant interconnects on the same substrate.

FIG. 2 illustrates an apparatus 200 including a die 210 having an integrated inductor 250. Apparatus 200 also includes a substrate 230 having connectors 240. Die 210 and substrate 230 may be connected by compliant interconnects 220. Apparatus 200 may also include a peripheral underfill 260.

Die 210 may be any suitable material. In an embodiment, die 210 may include silicon. In an embodiment, die 210 may be an integrated circuit (IC) chip of any type, including a microprocessor, microcontroller, ASIC (Application Specific Integrated Circuit), FPGA (Field Programmable Gate Array), DSP (Digital Signal Processor), memory, I/O (Input/Output) controller or hub, etc.

Substrate 230 may be any suitable material. In an embodiment, substrate 230 may include a printed circuit board (PCB). In an embodiment, substrate 230 may be formed from a rigid dielectric substrate, such as a standard PC (printed circuit) board material, for example, FR4 epoxy-glass, polyimide-glass, benzocyclobutene, Teflon, other epoxy resins, injection molded plastic or the like or ceramic. In an embodiment, substrate 230 may be about 40 mils (1.0 mm) thick, although it may be thicker or thinner.

Apparatus 200 may include a peripheral underfill 260. In comparison to an underfill that surrounds integrated inductor 250, peripheral underfill 260 may provide for improved performance of integrated inductor 250 because peripheral underfill 260 may allow integrated inductor 250 to be surrounded by air, which decreases the stray capacitance of integrated inductor 250.

In an embodiment, to decrease the stray capacitance of integrated inductor 250, metal layers adjacent to integrated inductor 250 may be removed. In an embodiment, metal layers adjacent to integrated inductor 250 may be removed from die 210. In another embodiment, metal adjacent to integrated inductor 250 may be removed from substrate 230.

Interconnects 220 may be any compliant interconnect as is further discussed below with reference to FIGS. 3-7. In an embodiment, interconnects 220 may provide data, control, and power interfaces to die 210.

Integrated inductor 250 may include any generally spiral shaped 3-D inductor that is integrated onto die 210 as is discussed with reference to FIG. 8. Integrated inductor may provide various functions, such as energy storage, selective channel frequency filtering, and noise reduction for die 210.

Die 210 may include any number of integrated inductors. In an embodiment, die 210 may include one integrated inductor. In an embodiment, die 210 may include 2 to 10 integrated inductors. In another embodiment, the number of integrated inductors may be based on design criteria. Apparatus 200 may also include any number of inductors, capacitors, and resistors embedded in substrate 230 or any number of surface mount inductors, capacitors, and resistors mounted to substrate 230.

FIG. 3 illustrates an example of an interconnect design that may be used for interconnects 220 of FIG. 2.

In FIG. 3, the interconnect has a base 21 that may be coupled to the die and an arch 23 that extends from the base to make contact with the substrate. The base of the interconnect may alternatively be attached to the substrate so that the arch contacts the die. The base is shown as an elongated beam with a bottom surface 25 to contact the surface of the die. The base may contact the die at a connection pad formed on the die for the purpose of electrically connecting to the base. The base may also include an elbow 27 at one end of the elongation to meet the arch. The beam may have a square cross-section about 20 µm in each direction and be about 50 µm long. The particular dimensions and proportions may be adapted to suit any particular application.

In the example of FIG. 3, the arch may be formed roughly as a quarter of a circle so that it rises perpendicularly from the beam up away from the die surface and then curves away from the beam. A tangent to the arch where it meets the beam may be normal to the plane of the die surface, while a tangent to the arch at its other end may be parallel to the plane of the die surface. If the portion of the circle where the arch meets the elbow is identified as 0 degrees on a circular compass, then the other end of the arch may be at 90 degrees from the elbow, along the circle. The arch may also have a square cross-section that is about 20 µm in height and width.

The arch may be formed as a smaller or larger part of a circle, or it may be formed as a portion of a noncircular curve instead of a circular curve as shown. The arch may extend beyond the quarter circle or 90 degrees to provide a longer or differently shaped surface to attach to the substrate. The particular radius of curvature, or radii of curvature if the arch is not circular in shape, may be selected to provide the desired mechanical properties. In one example, the beam and arch combined are 90 µm long and the arch has a circular radius of curvature of 40 µm. The particular dimensions and relative sizes of the beam and arch may be adapted to suit particular mechanical and electrical characteristics.

When the arch is made from a resilient material, such as a metal, it may act as a spring. The particular design of FIG. 3 may have mechanical properties similar to a leaf spring. Modifications to the spring shape may be made to adjust its resiliency, spring constant and other parameters. The arch has a top surface which may be the surface farthest from the bottom surface of the beam. This top surface may resiliently contact the package substrate, in this example, to create an electrical connection. The substrate or any other contacted surface may have a connection pad to provide a clear electrical connection path with the arch.

FIG. 4 illustrates an example of an interconnect design that may be used for interconnects 220 of FIG. 2.

In the example of FIG. 4, two interconnects, each with a beam and an arch similar to that shown in FIG. 3 are connected together to form a single integral compliant interconnect structure. The first half of the interconnect has a first beam 41 that connects to a first arch 43 at its elbow 47. This portion of the interconnect may be similar in shape to the interconnect of FIG. 3. A second half of the interconnect also has a second beam 42 that is roughly parallel to and aligned with the first beam. A second arch 44 extends from the second beam at an elbow. This portion of the interconnect may be similar in size and shape to the first portion of the interconnect.

The two portions of the interconnect may be connected by at least one crossbar. In the illustrated example, the beams are connected by a beam crossbar 48 that connects the ends of the two beams that are opposite the elbows. In the illustrated example, the crossbar has about the same height and width as the beams and has a length of about 70 µm, also about the same as the beams.

This beam crossbar may provide a larger surface to make electrical and mechanical contact with a connection surface on the die, for example a C4 pad. The crossbar may be positioned anywhere along the lengths of the two beams for this purpose. Additional crossbars may be added to connect the beam for electrical or mechanical reasons. In addition to providing a larger contact surface, the crossbar also shunts the two beams so that they carry the same signal to the arches.

A second crossbar 49 connects the ends of the two arches opposite the beams. This crossbar may have about the same dimensions as the beam crossbar and may shunt the two arches. By shunting across the two arches, impedances between the two arches may be reduced. This same shunt may also be provided by the substrate connector to which both arches will be attached. The arch crossbeam may also provide a larger surface for the connection to the substrate, which may be, for example, a C4 pad as well.

The crossbar shown in FIG. 4, by adding to the surface area of the electrical contact may make it significantly easier to align the interconnect with the connection pads to which they are to be connected. In one embodiment, the interconnect structures may be formed on the surface of the die and, in a separate process, a grid of pads may be deposited on the surface of the substrate. To connect the die to the substrate, the die may be aligned so that each of the interconnects is aligned with the appropriate pad and do not come too close to contacting any other pad. The larger area of the contact surfaces in the interconnects of FIG. 4 may make this alignment easier.

The crossbars may also provide greater stiffness to the interconnect structure. Additional crossbars may be added in different locations in order to further increase the stiffness. The crossbars may also be shaped or angled to achieve particular mechanical properties. In the example of FIG. 4, both crossbars are parallel to each other and perpendicular to the parallel beams. The crossbars may instead be at an angle to form cross-braces. X, Y and other patterns may be formed to stiffen the interconnect structure in particular directions.

Figure 5:
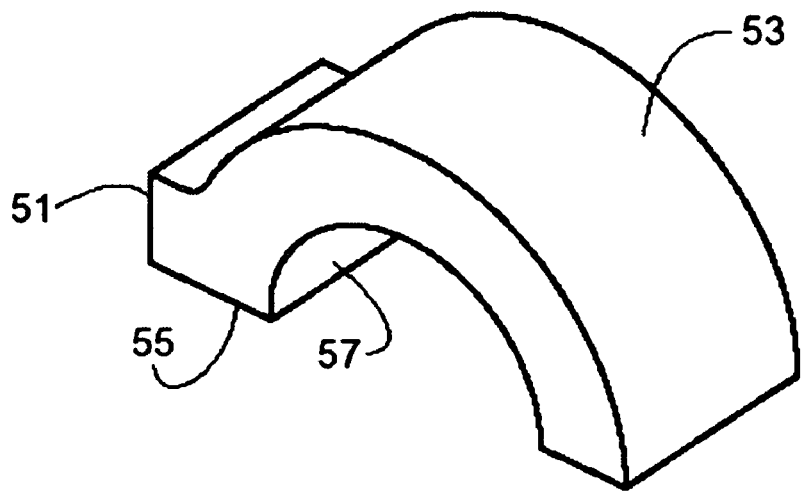
FIG. 5 illustrates a perspective view of a compliant interconnect.

FIG. 5 illustrates an example of an interconnect design that may be used for interconnects 220 of FIG. 2.

The example of FIG. 5 shows an interconnect design similar to that of FIG. 3 but with a broader and with a longer arch. The width may ease alignment with connection pads and increases the spring constant or resiliency of the arch portion. A longer arch may increase resiliency still more. Like the compliant interconnect of FIG. 3, the compliant interconnect of FIG. 5 has a base 51 that is coupled to the die and an arch 53 that extends from the base to make contact with the substrate. The base may be formed as an elongated beam with a bottom surface 55 to contact the surface of the die and an elbow 57 at one end of the elongation to meet the arch. The beam may be much wider than that of FIG. 3 with a similar height of about 20 µm but a width of about 60 µm. This width may include a smaller square bond pad 20 µm in each direction on its bottom surface. The arch may be similarly about 60 µm wide. However, in the example of FIG. 5, the arch extends through a half circle, 180 degrees, rather than the quarter circle of FIG. 3. The far end of the arch meets with the surface of the die. The remaining dimensions may be similar to those of the compliant interconnect of FIG. 3. Similar modifications and variations to those described above for the example of FIG. 3 may also be made.

Figure 6:
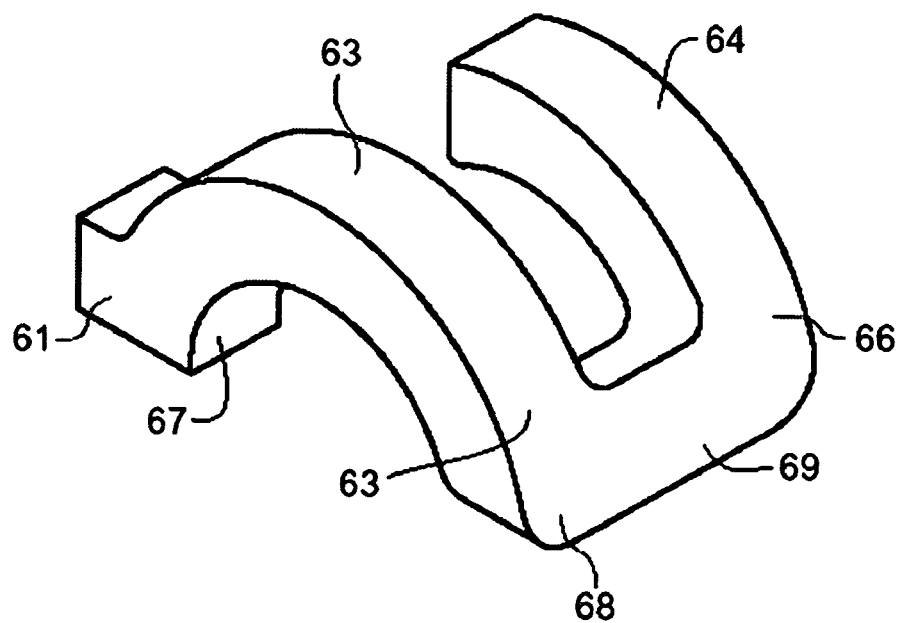
FIG. 6 illustrates a perspective view of a compliant interconnect.

FIG. 6 illustrates an example of an interconnect design that may be used for interconnects 220 of FIG. 2.

FIG. 6 shows another modification to the interconnect design of FIG. 3. In the example of FIG. 6, a beam 61, similar to the beam of FIG. 3 extends along the surface of the die and connects at an elbow 67 to an arch 63. Unlike the arch of FIG. 3, this arch extends through a semicircle away from the surface of the die and then back into contact with the surface of the die at a second elbow 68, a short distance from the beam. In an embodiment, the arch extends 180 degrees from the first elbow 67 to the second elbow 68. A second arch 64 parallel to and aligned with the first arch is separated from the arch by a short distance, 70 µm in the example shown. The two arches are joined together by a crossbar 69. The crossbar is attached to the first arch's second elbow 68 and to an elbow 66 on the second arch directly across from the first arch's second elbow.

The second arch may form a quarter circle similar in shape to the arch of FIG. 3. The two arches may be similar in shape and size to the two arches of FIG. 4. However, by extending the first arch another quarter circle back to the die surface, the two arches may be connected on the die surface away from the beam. This may change the mechanical properties of the interconnect. The crossbar in FIG. 5, similar to those of FIG. 4 is perpendicular to the beams and extends across the surface of the die to connect the two arches at their respective elbows. In one example, the arches may be 40 µm in radius, as in FIGS. 3 and 5, and the distance from the beam to the end of the half circle arch may be 140 µm.

Figure 7:
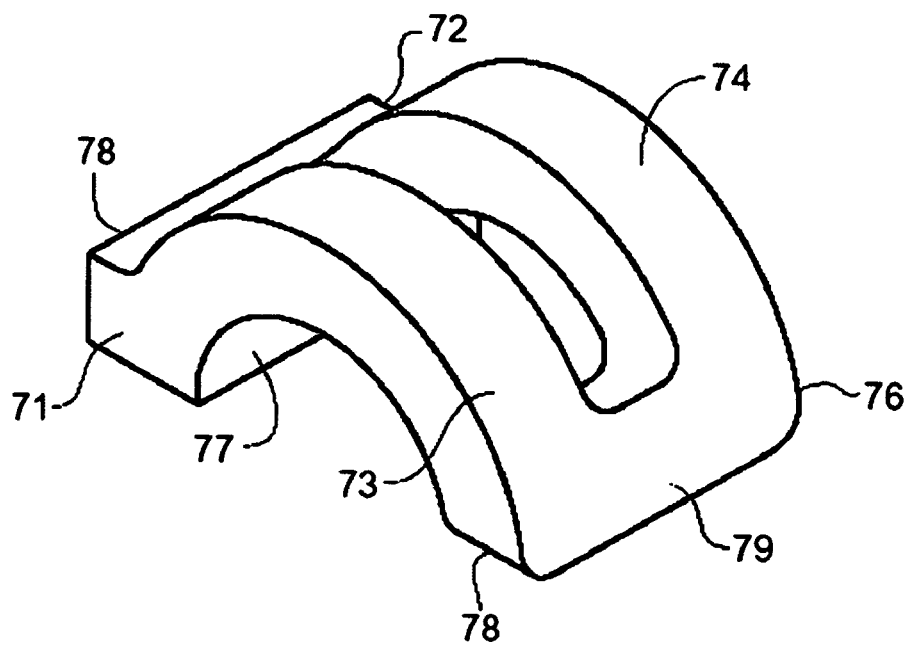
FIG. 7 illustrates a perspective view of a compliant interconnect.

FIG. 7 illustrates an example of an interconnect design that may be used for interconnects 220 of FIG. 2.

FIG. 7 shows a further variation on the compliant interconnect structures described above. The example of FIG. 7 is similar to that of FIG. 6 except that the second arch follows a complete semicircle to join with a second beam 72. The first and second beams 71, 72 are similar to the beams of FIG. 6 and are coupled together with a shunt 78. Both beams, opposite the shunt, connect at respective elbows 77 to respective arches 73, 74. Both arches extend through a semicircle away from the surface of the die and then back into contact with the surface of the die at respective second elbows 78, 76, a short distance from the beam.

The arches are parallel to and aligned with each other and separated from each other by a short distance. In this example, the arches are each 31 µm wide and 30 µm apart. The beams are similarly 31 µm wide and 30 µm apart. The two arches are joined together by a crossbar 79 that is attached to the two arches' respective elbows 76, 78. The interconnect of FIG. 7 combines features of the FIG. 5 and FIG. 5 interconnects to provide low resistivity, a large contact pad and a very stiff, resilient spring character.

In tests, the mechanical and electrical characteristics of the five different variations of compliant interconnects may be quantified. The version of FIG. 6 provides higher compliance, while the version of FIG. 4 provides less electrical resistance. The resistance of any of the variations may be reduced further by increasing the cross-sectional area such as in the version of FIG. 5. However, an increased cross-sectional area reduces the compliance of the structure.

Better electrical performance may also be obtained by shunting the compliant interconnect (as shown in FIGS. 4, 6, and 7 because the current is distributed over a larger area. On the other hand, shunting two arches or using more than one arch per connection point without shunting reduces the compliance in the structure by almost half compared to a single arch. This still provides more compliance than would be provided by an arch with an increased cross-section sufficient to obtain the same reduction in resistance. The version of FIG. 4, for example, shows more compliance and more resistance than the version of FIG. 6, which shows more compliance and more resistance than the version of FIG. 7.

Figure 8:
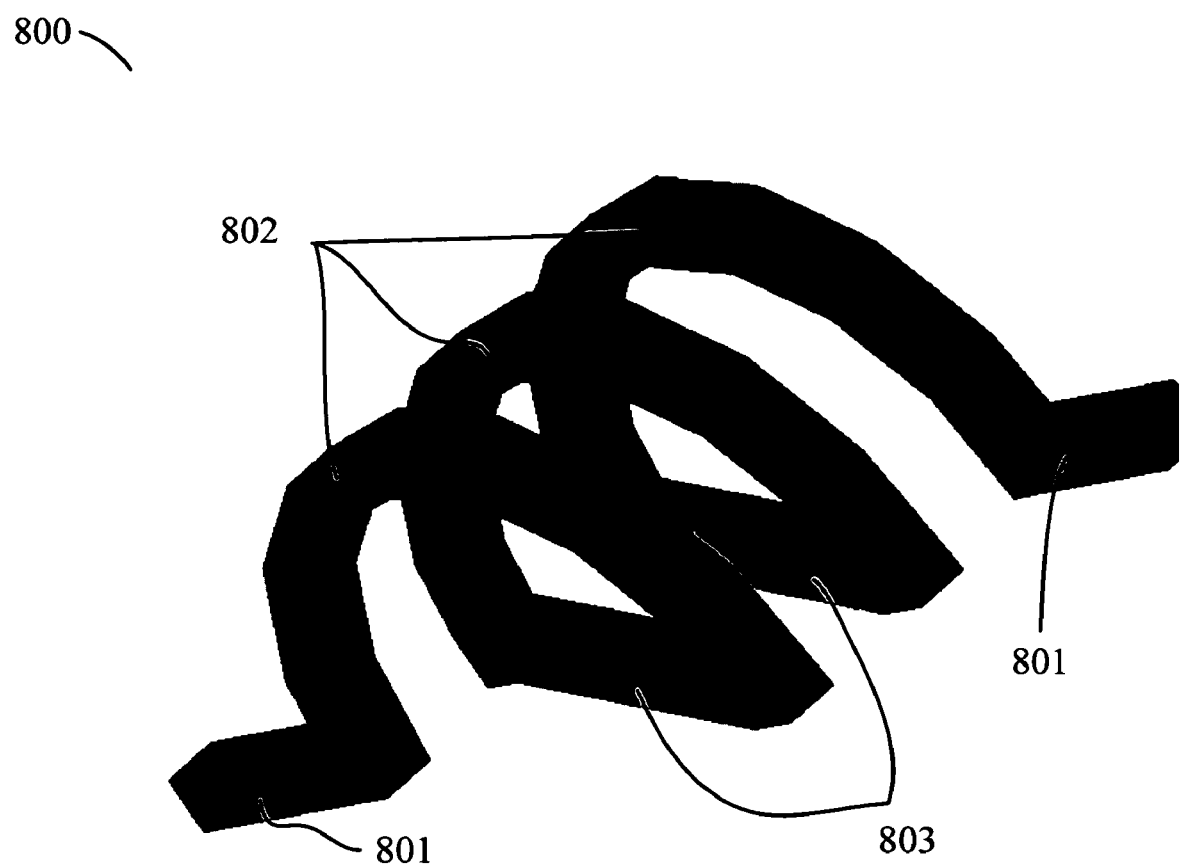
FIG. 8 illustrates a perspective view of a generally spiral shaped inductor.

FIG. 8 illustrates an example of an integrated inductor design that may be used for integrated inductor 250 of FIG. 2.

FIG. 8 illustrates an inductor 800 having connections 801, segments 803, and elements 802. A magnetic core may optionally run through the middle of inductor 800, between segments 803 and elements 802, as is further discussed below. In addition, inductor 800 may be on a substrate, as is further discussed below. However, neither a magnetic core nor a substrate are shown in FIG. 8 for the sake of clarity.

Inductor 800 may have a generally 3-D shape. For example, inductor 800 may include segments 803 that are substantially in a 2-D plane and elements 802 that extend out of that 2-D plane. Typically, a 2-D shape may be described as a shape that (of course) has three dimensions, but the measurement of the shape in one of the dimensions is constrained to be substantially constant. In a 3-D shape, there is no constraint on any of the dimensions. For example, a layer of material having a pattern may be considered a 2-D shape because the depth of the layer may be substantially constant across the layer. In contrast, inductor 800 has no such constraints in any dimension or direction and is therefore a 3-D shape. In an embodiment, inductor may be a 3-D inductor having a generally spiral shape.

Elements 802 are illustrated as arcs in FIG. 8. However, any suitable shape may be used. In an embodiment, elements 802 may be formed using any available support shape, such as a dome or a column. Therefore, elements 802 may be of any shape that facilitates connection to the ends of segments 803 and allows a magnetic material to run between elements 802 and segments 803. In an embodiment, segments 803 may be in the shape of an arc. In another embodiment, segments 803 may be in the shape of an arch having a squared off bottom and a rounded top. In another embodiment, segments 803 may be in the shape of an arch having a rounded bottom and a squared off top. Several other shapes, such as, for example, an arch having an oval bottom and top, may be available.

As illustrated in FIG. 8, segments 803 may generally be segments that are aligned in rows. However, the only restraint on the layout of segments 803 is that they may be able to form the generally spiral shape of inductor 800. Specifically, segments 803 need not be the same length, nor do segments 803 need to be parallel. Further, as is illustrated in FIG. 8, elements 802 may generally connect opposite ends of adjacent segments 803 to form the spiral shape of inductor 800.

FIG. 8 illustrates connections 801 connecting to ends of elements 802 and extending away from inductor 800. However, connections 801 may connect to inductor 800 in any way. In an embodiment, connections 800 may connect to segments 803. In another embodiment, elements 802 may connect to shorter segments (not shown) that are similar to segments 803, but only extend to a center line of inductor 800. In other embodiments, connections 800 may extend away from inductor 800 along a line extending along the center line of inductor 800.

FIG. 8 illustrates inductor 800 having 3 turns; however, any number of turns may be used. In an embodiment, inductor 800 may have 5 turns. In another embodiment, inductor 800 may have 10 turns. In other embodiments, inductor 800 may have any of 1 to 20 turns.

Inductor 800 illustrated in FIG. 8 may have any dimensions. In some embodiments, the width of inductor 800 may be in the range of about 100 to 200 microns. In an embodiment, the width may be in the range of about 100 to 160 microns. In another embodiment, the width may be in the range of about 140 to 160 microns. In an embodiment, the width may be about 150 microns. In some embodiments, the height of inductor 800 may be in the range of about 40 to 100 microns. In an embodiment, the height of inductor 800 may be in the range of about 40 to 80 microns. In another embodiment, the height may be in the range of about 60 to 80 microns. The length of inductor 800 may vary according to the number of turns. In an embodiment, the pitch between turns in inductor 800 may be in the range of about 50 to 130 microns. In another embodiment, the pitch between turns in inductor 800 may be in the range of about 50 to 100 microns. In an embodiment, the pitch between turns in inductor 800 may be in the range of about 80 to 100 microns. In an embodiment, the pitch between the turns may be about 90 microns.

Elements 802 and segments 803 may include any suitable material. In an embodiment, elements 802 and segments 803 may be conductive. In some embodiments, elements 802 and segments 803 may be plated copper. In an embodiment, elements 802 and segments 803 may include aluminum. In another embodiment, elements 802 and segments 803 may include gold.

Inductor 800 may have any performance characteristics. The performance characteristics of inductor 800 may generally depend on a wide number of factors, such as the number of turns, the materials, sizes and shapes of elements 802, segments 803, and the magnetic core, and the X-Y-Z dimensions of inductor 800.

As discussed, a magnetic core may run through the middle of inductor 800. In various embodiments, the magnetic core may include CoZrTa, a permalloy, NiFe, FeTaN, NiFeRe, or CoNbZr.

The compliant interconnects and integrated inductor described may be fabricated in many ways. FIGS. 9A-9H illustrate a method that may provide for compliant interconnects and an integrated inductor on a substrate.

Figure 9A:
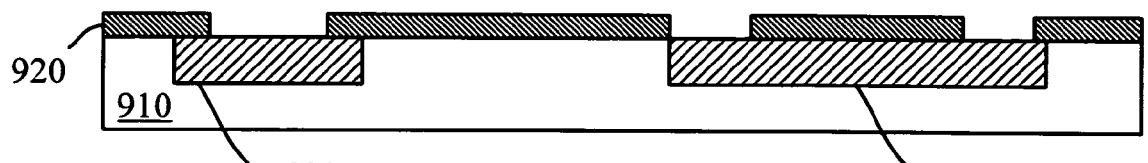
FIGS. 9A-9H illustrate a method for forming a compliant interconnect and an integrated inductor.

As illustrated in FIG. 9A, a substrate 910 having a pad 930, a conductive segment 940, and a pattern layer 920 may be provided. Substrate 910 may be any suitable material. In an embodiment, substrate 910 may include a semiconductor. In an embodiment, substrate 910 may be a die. In various embodiments, substrate 910 may include silicon, gallium arsenide, lithium niobate, ceramic or any of a variety of other materials to which photolithography may be applied. Substrate 910 may also include a variety of devices, including transistors and resistors, and a variety of insulative, conductive, and semiconductive regions that form metallization layers, isolation regions, channel regions, source and drain regions and the like. In an embodiment, substrate 910 may include a microprocessor.

Pattern layer 920 may include any suitable material. In an embodiment, pattern layer 920 may include a passivation layer of dielectric. In an embodiment, pattern layer 920 may include silicon nitride or polyimide. Pattern layer 920 includes an opening over pad 930. Pattern layer 920 may also any number of openings over conductive segment 940.

Only a single conductive segment 940 and two openings in pattern layer 920 are illustrated in FIG. 9A. However, any number of conductive elements may be substantially parallel to conductive segment 940 and any number of openings may be provided such that elements may contact the conductive elements to form a generally spiral shaped 3-D integrated inductor having any number of turns as discussed with reference to FIG. 8. Further, connections (not shown), also as discussed with reference to FIG. 8, may also be provided in substrate 910.

Pad 930 and conductive segment 940 may be any suitable conductive material. In an embodiment, pad 930 and conductive segment 940 may include copper.

Figure 9B:
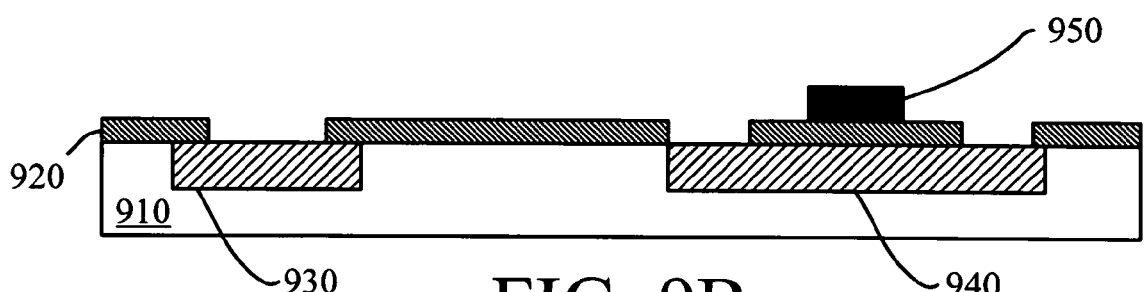

As illustrated in FIG. 9B, a magnetic material 950 may be formed over pattern layer 920 and above conductive segment 940. Magnetic material 950 may include any suitable magnetic material and may be formed by any suitable technique. In some embodiments, magnetic material 950 may include permalloys. In other embodiments, magnetic material 950 may include NiFe, FeTaN, or NiFeRe, or any combination thereof. In an embodiment, magnetic material 950 may include CoZrTa. In another embodiment, magnetic material 950 may include CoNbZr.

In an embodiment, magnetic material 950 may be formed by providing a coating of a magnetic material over substrate 910, patterning a layer of resist over the magnetic material, etching undesired portions of the magnetic material, and removing the resist.

In another embodiment, magnetic material 950 may be formed by patterning a layer of resist over substrate 910, selectively forming a magnetic material in an opening in the resist, and removing the resist.

In an embodiment, a magnetic material may not be provided.

Figure 9C:
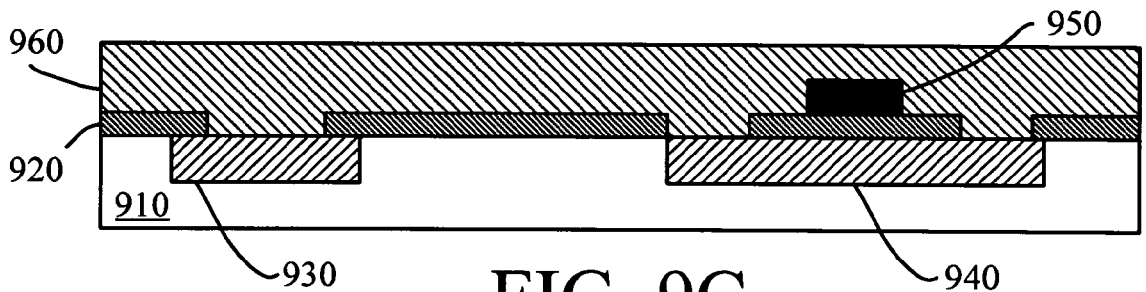

As illustrated in FIG. 9C, a resist layer 960 may be formed over substrate 910. Resist layer 960 may include any suitable resist.

Figure 9D:
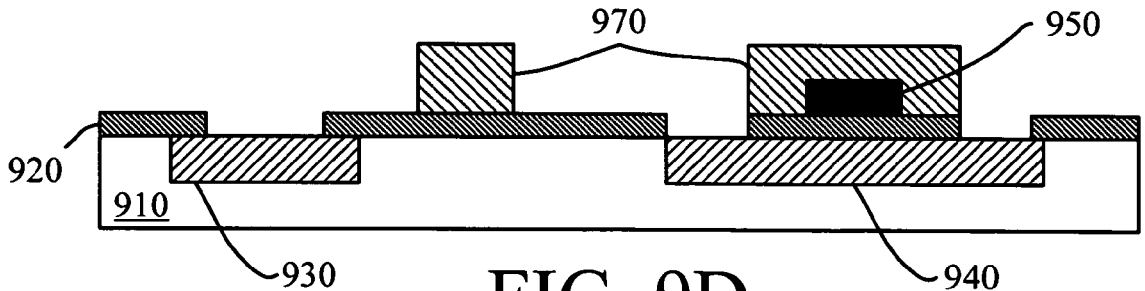

As illustrated in FIG. 9D, resist layer 960 may be patterned to form columns 970. Columns 970 may be any suitable size and shape. In an embodiment, columns 970 may be posts or elongated rectangles.

Figure 9E:
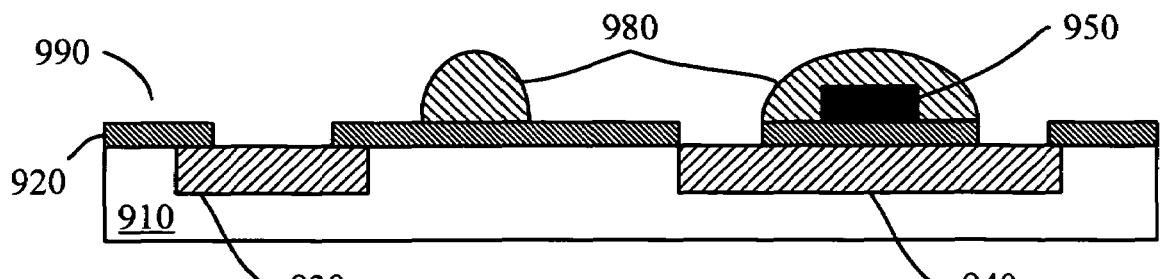

As illustrated in FIG. 9E, columns 970 may be reflowed to form domes 980, or any other curved shape. In an embodiment, domes 980 may be formed by exposing the resist to a solvent. In an embodiment, domes 980 may be formed using a bake step. In an embodiment, domes 980 may be formed by baking at a temperature in the range of about 100 to 120° C. for a time in the range of about 15 to 45 minutes. In another embodiment, domes 980 may be formed by multiple baking steps. In an embodiment, a first bake at a temperature in the range of about 100 to 120° C. for a time in the range of about 15 to 45 minutes and a second bake at a temperature in the range of about 100 to 150° C. for a time in the range of about 15 to 45 minutes may be used to form domes 980.

Figure 9F:
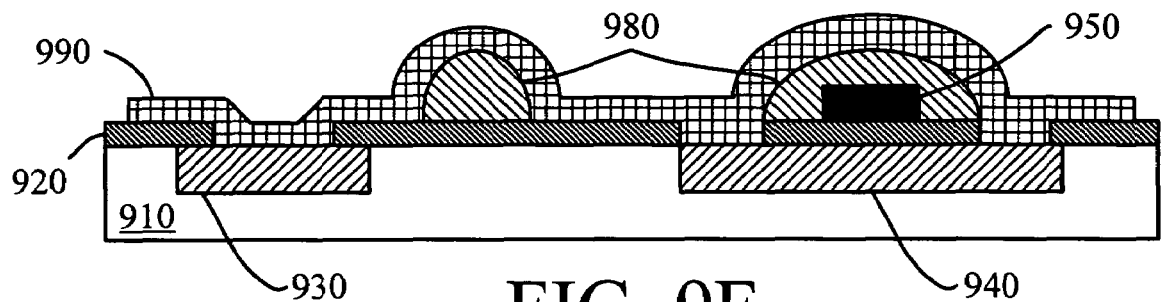

As illustrated in FIG. 9F, a conductor 990 may be formed over substrate 910 and domes 980. Conductor 990 may include a single material or two or more materials. In an embodiment, conductor 990 may include metal. In some embodiments, conductor 990 may include metals such as such as aluminum (Al) copper (Cu), titanium (Ti), nickel (Ni), gold (Au), silver (Ag), tin (Sn), tantalum (Ta), molybdenum (Mo), chromium (Cr), or cobalt (Co), or any combination thereof. The choice of materials and the number of layers of conductor 990 may depend on the desired characteristics of the compliant interconnects and integrated inductor to be formed. Conductor 990 may be formed by any suitable technique, including sputtering, chemical vapor deposition, physical vapor deposition, atomic layer deposition, electro plating, electroless plating, or others.

Figure 9G:
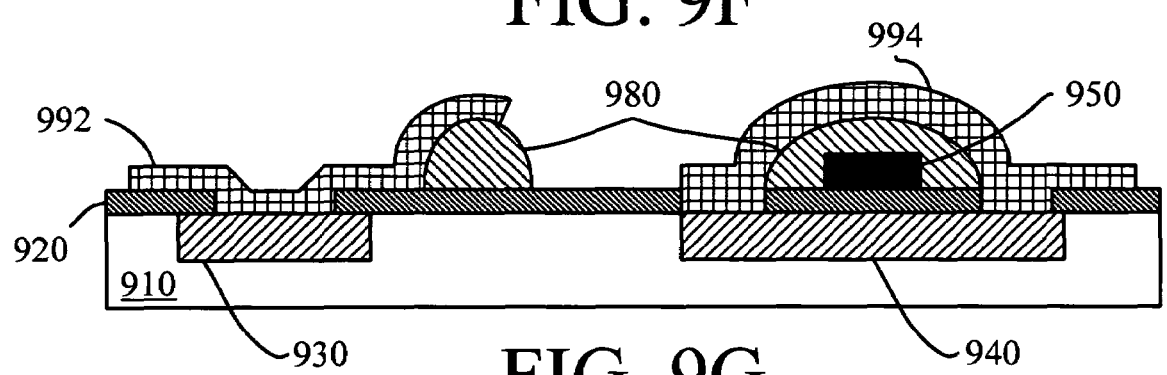

As illustrated in FIG. 9G, conductor 990 may be patterned to form a compliant interconnect 992 and an integrated inductor 994. In an embodiment, conductor 990 may be patterned by a patterning and etching process. A variety of patterns may be applied to form compliant interconnect 992 such that it has the shape of any compliant interconnect as discussed above. Integrated inductor 994 may be patterned to form conductive elements as discussed with reference to FIG. 8 above.

Figure 9H:
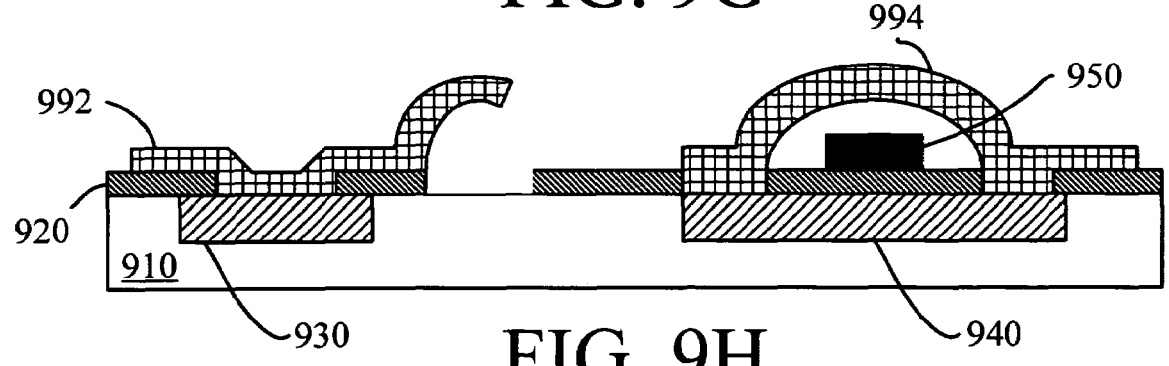

As illustrated in FIG. 9H, domes 980 may be removed. In an embodiment, domes 980 may be stripped using a resist strip process.

Figure 10:
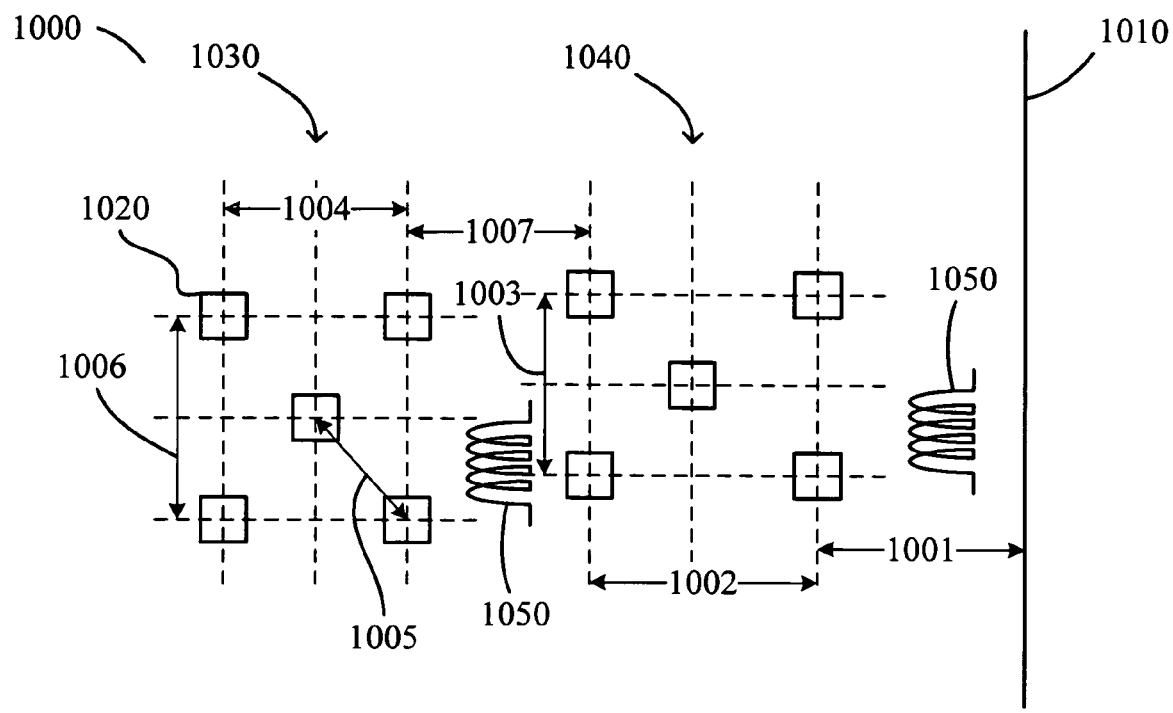
FIG. 10 illustrates a top-down view of a die layout including pads and an inductor.

FIG. 10 illustrates an example of a die layout including an integrated inductor. An integrated inductor may be located in the die layout in various positions.

FIG. 10 illustrates a die 1000, a die edge 1010, a core pad layout 1030, an input/output (I/O) pad layout 1040, and inductors 1050. Core pad layout 1030 and I/O pad layout 1040 each include about five pads 1020. FIG. 10 also illustrates a variety of distances 1001, 1002, 1003, 1004, 1005, 1006, 1007.

As discussed with reference to FIG. 8, in various embodiments, an integrated inductor may be about 100 to 200 microns wide and the length may depend on the number of turns, and the pitch between turns may be in the range of about 50 to 130 microns.

In an embodiment, an integrated inductor may be placed on die 1000 wherever space is provided for the integrated inductor between pads 1020. In another embodiment, an inductor may be placed on die 1000 in the location of one or more pads and the pads may be covered with, for example, a passivation layer.

Typically, the layout of pads 1020 on die 1000 may be restricted by design rules that limit, for example, how closely the pads may be placed. In the example of FIG. 10, distance 1005 may illustrate the closest that any two pads may be placed. In an embodiment, distance 1005 may be in the range of about 120 to 180 microns, distance 1001 may be in the range of about 210 to 250 microns, distance 1002 may be in the range of about 280 to 340 microns, distances 1003, 1004, and 1007 may be in the range of about 190 to about 230 microns, and distance 1006 may be in the range of about 230 to 280 microns.

In the illustrated embodiment, I/O pad layout 1040 may be near the edge of die 1000. In an embodiment, I/O pad layout 1040 may include an off face center rectangle (OFCR) layout including five pads orientated with four pads at the corners of a rectangle and with one pad off-center in the rectangle. In an embodiment, the pad closest to die edge 1010 may be centered about 210 to 250 microns in from die edge 1010 and integrated inductor 1050 may be placed between die edge 1010 and the pad closest to die edge 1010.

In an embodiment, core pad layout 1030 may include a face center rectangle (FCR) layout including five pads oriented with four pads in a rectangle and one pad in the center of the rectangle. In an embodiment, core pad layout 1030 may be adjacent to I/O pad layout 1040. In an embodiment, adjacent pads of core pad layout 1030 and I/O pad layout 1040 may be centered about 190 to 23 microns apart and integrated inductor 1050 may be placed between die edge core pad layout 1030 and I/O pad layout 1040.

Many other locations may be available for placing an integrated inductor on die 1000, such as between adjacent I/O pad layouts and between adjacent core pad layouts.

Further, an integrated inductor may be placed substantially between any pad layouts, but overlapping partially with a pad layout. In such embodiments, the pads that are overlapped by the integrated inductor may be covered with, for example, a passivation layer.

Figure 11:
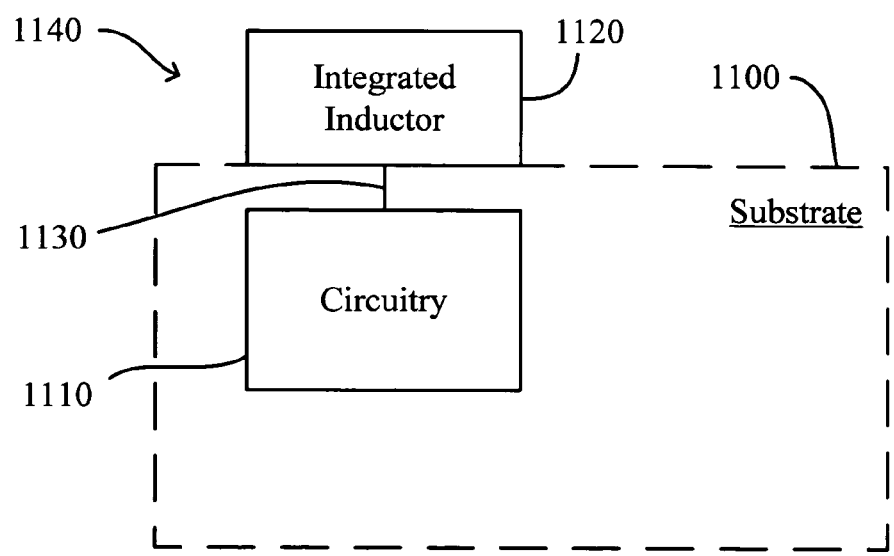
FIG. 11 illustrates a schematic of a circuit including an integrated inductor implemented partially in a substrate.

FIG. 11 illustrates a circuit partially implemented in a substrate including an integrated inductor. FIG. 11 illustrates a substrate 1100 and a circuit 1140 including circuitry 1110, integrated inductor 1120, and connection 1130. As illustrated in FIG. 11, circuit 1140 may be partially implemented in substrate 1100. That is, circuitry 1110 may be a portion of circuit 1140 that may be implemented in substrate 1100. In an embodiment, circuitry 1110 may include a transistor. In an embodiment, circuitry 1110 may include a capacitor. Integrated inductor 1120 may also be a portion of circuit 1140 and may be implemented on substrate 1100. In various embodiments, integrated inductor 1120 may include any integrated inductor discussed above. Connection 1130 may electrically connect circuitry 1110 and integrated inductor 1120.

Circuit 1140 may be any circuit that includes an integrated inductor and a portion of circuitry that may be implemented in a substrate. In an embodiment, circuit 1140 may be a frequency filter circuit. In an embodiment, circuit 1140 may be a low pass frequency filter circuit. In another embodiment, circuit 1140 may be a high pass frequency filter circuit. In an embodiment, circuit 1140 may be a band pass frequency filter circuit. In an embodiment, circuit 1140 may be an impedance matching circuit. In an embodiment, circuit 1140 may include an inductance-capacitance (LC) resonant tank. In an embodiment, circuit 1140 may include a capacitor having a capacitance less than about 1 pF. In another embodiment, integrated inductor 1120 may have an inductance less than about 3 nH.

Figure 12:
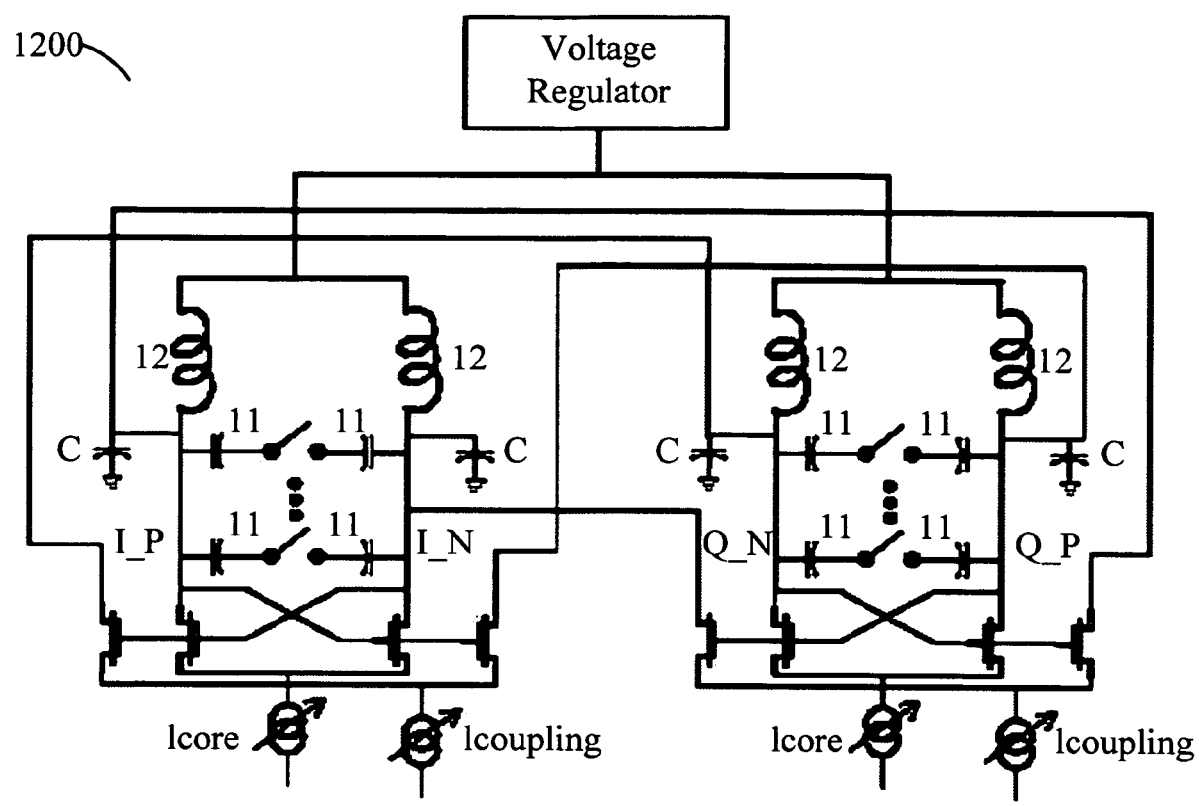
FIG. 12 illustrates a schematic of a portion of a voltage controlled oscillator circuit including an LC tank.

FIG. 12 illustrates a portion of a voltage controlled oscillator (VCO) circuit 1200 that may be enabled by the use of an integrated inductor. As discussed, a portion of VCO circuit 1200 may be implemented in a substrate. In an embodiment, VCO circuit 1200 may include a circuit with an inductance-capacitance (LC) resonant tank. As illustrated, VCO circuit 1200 includes tuning capacitors 11 and inductors 12.

In various embodiments, VCO circuit 1200 may operate with a high frequency. To implement a high frequency VCO circuit, a high resonant frequency (and accordingly, components with low capacitance and inductance) may be required. In various embodiment, VCO circuit 1200 may operate at a frequency of about 10 GHz or more and tuning capacitors 11 may have capacitances in the range of about 0.2 to 0.3 pF.

In such embodiments, inductors 12 may be required to have very low inductance and, in implementing the inductor, a very low loop inductance. In an embodiment, an integrated inductor, such as a generally spiral shaped 3-D inductor, may provide the low inductance and loop inductance required to enable the VCO. In an embodiment, the integrated inductor may be integrated on the substrate. In an embodiment, the integrated inductor may have an inductance in the range of about 0.7 to 0.9nH. In another embodiment, the integrated inductor may have a loop inductance less than about 1 nH. In an embodiment, the integrated inductor may be a generally spiral shaped 3-D inductor having a magnetic core and up to about 15 turns.

Figure 13:
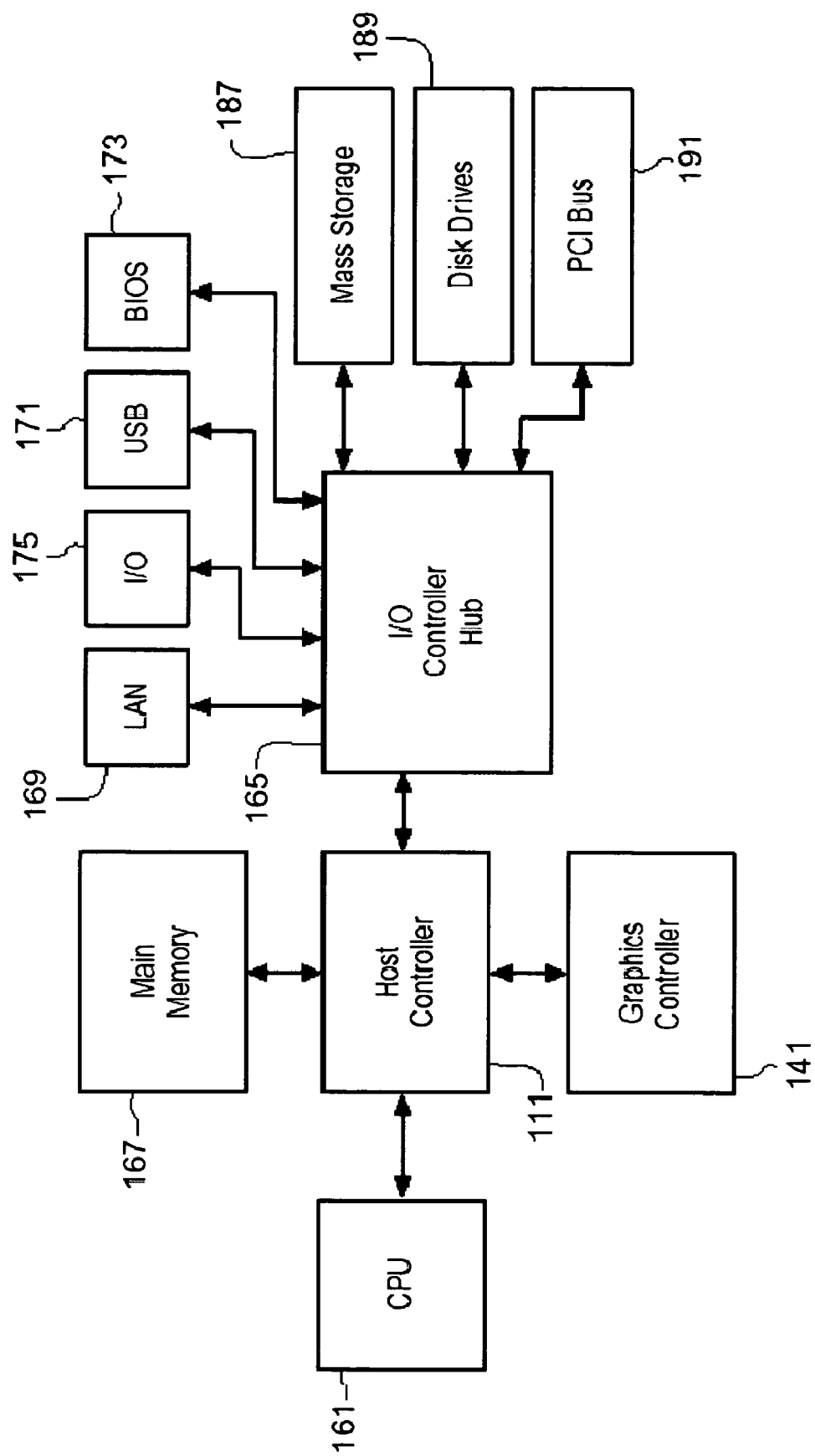
FIG. 13 illustrates a schematic of a system.

FIG. 13 illustrates a system in accordance with an embodiment of the present invention.

FIG. 13 shows an example of a computer system containing several different IC components to which embodiments of the present invention may be applied. Embodiments of the present invention may be adapted for application on a great number of different ICs, including microprocessor packages and chipsets. In this example, the computer system may include a CPU (Central Processing Unit) 161 coupled to a chipset component 111 such as a Memory Controller Hub (MCH) chip. The MCH functions as part of a supporting chipset for the CPU. The MCH is coupled to a main memory 167, such as DRAM (Dynamic Random Access Memory) and to a graphics controller 141.

The MCH 111 is also coupled to an ICH (Input/Output controller hub) 165. The ICH offers connectivity to a wide range of different devices. Well-established conventions and protocols may be used for these connections. The connections may include a LAN (Local Area Network) port 169, a USB hub 171, and a local BIOS (Basic Input/Output System) flash memory 173. A SIO (Super Input/Output) port 175 may provide connectivity for a keyboard, a mouse, and any other human interface devices.

The ICH may also provide an IDE (Integrated Device Electronics) bus for connections to disk drives 187, 189 or other large memory devices. The mass storage may include hard disk drives and optical drives. A PCI (Peripheral Component Interconnect), a PCI-X bus or a PCI-Express bus 191 may be coupled to the ICH to allow a wide range of devices and ports to be coupled to the ICH. The architecture of FIG. 13 allows for a wide range of different functions and capabilities. The specific details of any implementation will depend on the particular application.

The CPU, MCH, ICH, LAN port, USB hub, BIOS, SIO port, IDE and PCI buses may all be carried on a single motherboard of the computer system. Any one or more peripheral devices may also be carried on the motherboard. The computer system may be adapted for use in many different applications including office productivity, communications, entertainment, music and video production or manufacturing.

Although the description of the various embodiments refers primarily to using compliant interconnects and integrated inductors in conjunction with an integrated circuit package, the various embodiments may also be used with other types of packages, interposers, PC boards or other electronic circuit housings. The various embodiments may be used with various types of electronic assemblies, and are not to be limited to use with integrated circuit packages.

In addition, the various embodiments may be used with a number of different types of packages and packaging technologies, for example, organic or ceramic packages, and technologies such as land grid array (e.g., organic LGA), pin grid array (e.g., plastic PGA or flip chip PGA), ball grid array (e.g., microBGA, tape BGA, plastic BGA, flip chip BGA or flip chip tape BGA), and beam lead may be used to attach the CI's to a die or a substrate.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method comprising:
   forming a magnetic core over a pattern layer on a substrate having a conductive pad and a conductive element;
   patterning a resist layer over the substrate, wherein a first portion of the resist layer is over the magnetic core and a second portion of the resist layer is over the pattern layer;
   reflowing the resist layer to form a first dome over the magnetic core and a second dome over the pattern layer;
   forming a conductive layer over the substrate; and
   patterning the conductive layer to form a compliant interconnect and an integrated inductor.

2. The method of claim 1, further comprising
   removing the first dome and the second dome.

3. The method of claim 1, wherein forming the magnetic core comprises depositing a magnetic material over the substrate, patterning a second resist layer over the magnetic material, and etching a portion of the magnetic material.

4. The method of claim 1, wherein forming the magnetic core comprises forming the magnetic core over the conductive element, and patterning the conductive layer includes removing a portion of the conductive layer over the magnetic core.

5. The method of claim 1, wherein patterning the conductive layer includes removing a portion of the conductive layer over the second dome.

6. The method of claim 1, wherein the magnetic material comprises at least one of CoZrTa, a permalloy, NiFe, FeTaN, NiFeRe, or CoNbZr.

* * * * *